United States Patent
Nguyen et al.

(10) Patent No.: US 9,041,390 B1
(45) Date of Patent: May 26, 2015

(54) DIGITALLY CONTROLLED HIGH-CURRENT DC TRANSDUCER

(71) Applicant: Neilsen-Kuljian, Inc., San Jose, CA (US)

(72) Inventors: Huy D. Nguyen, Tracy, CA (US); Tom Lik-Chung Lee, San Jose, CA (US)

(73) Assignee: NEILSEN-KULJIAN, INC., San Jose, CA (US)

( * ) Notice: Subject to any disclaimer, the term of this patent is extended or adjusted under 35 U.S.C. 154(b) by 0 days.

(21) Appl. No.: 14/476,495

(22) Filed: Sep. 3, 2014

(51) Int. Cl.
*G01R 33/00* (2006.01)
*G01R 33/07* (2006.01)
*G01R 15/12* (2006.01)

(52) U.S. Cl.
CPC ............ *G01R 33/0023* (2013.01); *G01R 33/07* (2013.01); *G01R 33/0035* (2013.01); *G01R 15/125* (2013.01)

(58) Field of Classification Search
CPC .. G01R 15/125; G01R 33/07; G01R 33/0023; G01R 33/0035; G01R 33/0082
See application file for complete search history.

(56) References Cited

U.S. PATENT DOCUMENTS

| | | | | |
|---|---|---|---|---|
| 4,886,980 | A * | 12/1989 | Fernandes et al. | 307/64 |
| 6,043,641 | A * | 3/2000 | Singer et al. | 324/127 |
| 6,566,855 | B1 * | 5/2003 | Nguyen et al. | 324/117 R |
| 6,917,203 | B1 * | 7/2005 | Perotti et al. | 324/418 |
| 2010/0211347 | A1 * | 8/2010 | Friedrich et al. | 702/117 |
| 2010/0244868 | A1 * | 9/2010 | Cantave et al. | 324/754 |
| 2013/0009655 | A1 * | 1/2013 | Marten | 324/713 |
| 2013/0015843 | A1 * | 1/2013 | Doogue et al. | 324/202 |
| 2014/0043085 | A1 * | 2/2014 | Motz | 327/307 |

* cited by examiner

*Primary Examiner* — Huy Q Phan
*Assistant Examiner* — Adam Clarke
(74) *Attorney, Agent, or Firm* — TIPS Group (57) ABSTRACT

A direct current transducer includes an open-loop Hall-effect sensor, a first ADC coupled to the open-loop Hall-effect sensor, a thermistor, a second ADC coupled to the thermistor, a manually controlled mode-selection device, a digital processor coupled to the first ADC and the second ADC, and digital memory coupled to the digital processor. The manually controlled mode-selection device is operative to develop an operating mode selection digital signal for a plurality of operating modes including a temperature-compensated direct current (DC) transducer mode and a calibration mode.

19 Claims, 12 Drawing Sheets

DIGITALLY CONTROLLED HIGH-CURRENT DC TRANSDUCER

BACKGROUND

A current sensor is a device that detects electrical current in a conductor and generates an output signal proportional to the detected current. Current sensors can detect either alternating current (AC) or direct current (DC) flowing in the conductor.

Many DC current sensors in the market today use Hall-effect sensors as the primary element for detecting a magnetic field generated by current flowing through the conductor. A Hall-effect sensor is a transducer that varies its output voltage in response to a magnetic field.

Hall-effect sensors can be used in open-loop and closed-loop configurations. Generally speaking, an open-loop Hall-effect sensor uses the Hall voltage directly to produce an output signal. This configuration has the advantage of being simpler to implement, but suffers from a significant amount of nonlinearity. A closed-loop Hall-effect sensor, in contrast, has a coil that is actively driven to produce a magnetic field that opposes the field produced by the current being sensed. In this configuration, the Hall-effect sensor is used as a null-detecting device with the output signal being proportional to the current being driven into the coil, which is proportional to the current being measured. This method is more complex than the open-loop method, but it has the advantage of greatly reducing nonlinearities associated with the Hall-effect sensor itself, since it is essentially being operated at a single point in its range.

With high current DC sensors (e.g. on the order of tens of amperes and above), Hall-effect sensors are typically used in an open-loop configuration due to the large currents that would have to be applied to the coil of a closed-loop configuration. Since Hall-effect sensors are inherently temperature sensitive, the output of an open-loop Hall-effect sensor tends to experience offset and/or linearity drift as its temperature varies.

When a Hall-effect sensor is provided with signal processing to provide relatively low current or voltage outputs (e.g. industry standard 4-20 mA, 0-5 VDC or 0-10 VDC outputs) they are often referred to as "DC current transducers." Such signal processing tends to be analog in nature, requiring one or more trimming potentiometers ("trim pots") for proper calibration. While analog circuitry is relatively inexpensive, it suffers from a lack of accuracy in that trims pot tends have a tolerance in the +20% range. Furthermore, manual calibration by adjusting one or more trim pots is a time consuming, and therefore expensive, part of the manufacturing process. Also, analog circuitry is not well adapted to compensate for temperature variations, thereby further increasing the error of the measurement.

These and other limitations of the prior art will become apparent to those of skill in the art upon a reading of the following descriptions and a study of the several figures of the drawing.

SUMMARY

In an embodiment, set forth by way of example but not limitation, a digitally controlled direct current transducer includes an open-loop Hall-effect sensor, a first analog-to-digital converter (ADC) coupled to the open-loop Hall-effect sensor, a temperature sensor, a second ADC coupled to the temperature sensor, a manually controlled mode-selection device, a digital processor coupled to the first ADC and the second ADC, and digital memory coupled to the digital processor. The open-loop Hall-effect sensor is operative to develop a first sensor analog output which is converted by the first ADC to a first digital signal. The temperature sensor is operative to develop a second sensor analog output which is converted by the second ADC to a second digital signal. The manually controlled mode-selection device is operative to develop an operating mode selection digital signal for a plurality of operating modes including a temperature-compensated direct current (DC) transducer mode and a calibration mode. The digital processor is responsive to the first digital signal, the second digital signal and the operating mode selection digital signal. In this non-limiting example, the digital memory includes thermal curve information and code segments executable on the digital processor for: (a) performing initialization routines in response to the powering-up of the digital processor; (b) operating in the temperature-compensated DC transducer mode using the first digital signal, the second digital signal and the thermal curve information to produce a digital output of the digital processor that is representative of the first sensor analog output when the manually controlled mode-selection device is set to develop the operating mode selection digital signal for the temperature-compensated DC transducer mode; and (c) operating in the calibration mode when the manually controlled mode-selection device is set to develop the operating mode selection digital signal for the calibration mode.

In another embodiment, set forth by way of example but not limitation, a direct current transducer includes an open-loop Hall-effect sensor, a first analog-to-digital converter (ADC) coupled to the open-loop Hall-effect sensor, a thermistor, a second ADC coupled to the thermistor, a manually controlled mode-selection device, a digital processor coupled to the first ADC and the second ADC, and digital memory coupled to the digital processor. The open-loop Hall-effect sensor is operative to develop a Hall-effect sensor analog output which is converted by the first ADC to a Hall-effect digital signal. The thermistor is operative to develop a thermistor analog output which is converted by the second ADC to a thermistor digital signal. The manually controlled mode-selection device is operative to develop an operating mode selection digital signal for a plurality of operating modes including a temperature-compensated direct current (DC) transducer mode and a calibration mode. The digital processor is responsive to the Hall-effect digital signal, the thermistor digital signal and the operating mode selection digital signal. The digital memory includes thermal curve information and code segments executable on the digital processor for: (a) operating in the temperature-compensated DC transducer mode using the Hall-effect digital signal, the thermistor digital signal and the thermal curve information to produce a digital output of the digital processor that is representative of the Hall-effect sensor analog output when the manually controlled mode-selection device is set to develop the operating mode selection digital signal for the temperature-compensated DC transducer mode; and (b) operating in the calibration mode when the manually controlled mode-selection device is set to develop the operating mode selection digital signal for the calibration mode.

An advantage of certain example embodiments is that analog signal processing has been replaced by digital logic in the form of a digital processor which can operate in a plurality of operating modes, including a temperature-compensated DC transducer mode (with greatly increased linearity) and a calibration mode, which calibrates the transducer without requiring a technician to adjust one or more trim pots. Advantageously, the operational modes of a transducer can be selected with a manually operated mode-selector having a digital output such that the transducer can be easily recalibrated.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
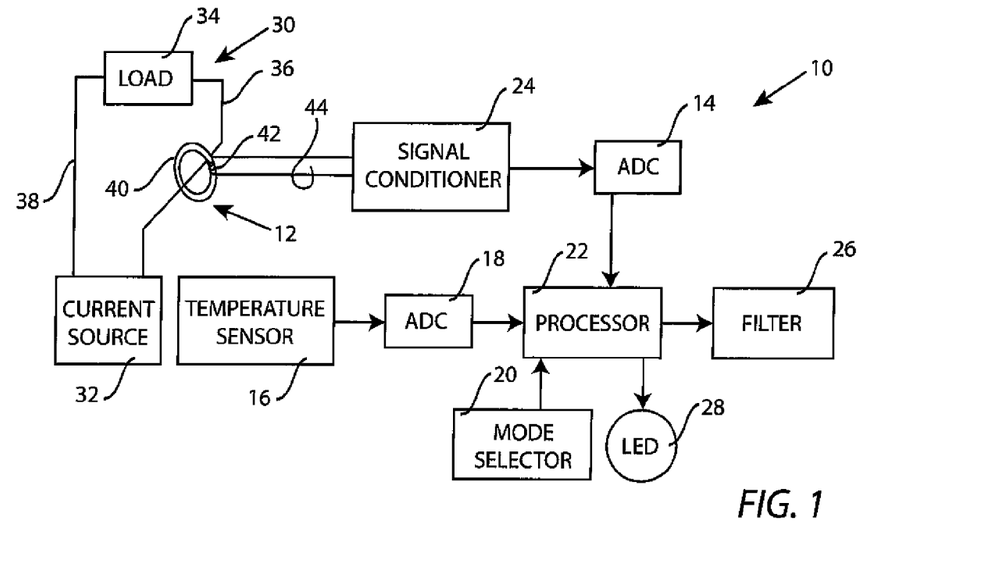
FIG. 1 is a block diagram of an example digitally controlled direct current transducer with a calibration current source and a load.

FIG. 1 is a block diagram illustrating, by way of example and not limitation, a digitally controlled direct current (DC) transducer 10 including an open-loop Hall-effect sensor 12, a first analog-to-digital converter (ADC) 14, a temperature sensor 16, a second ADC 18, a manually controlled mode-selection device ("mode-selector") 20, and a processor 22. The DC transducer 10 may further include a signal conditioner 24, a filter 26, and an indicator 28, such as a light-emitting diode (LED). Also seen in FIG. 1 is a circuit 30 including a current source 32, a load 34, and conductors 36 and 38. In this example, conductor 36 extends through the annulus of Hall-effect sensor 12.

The open-loop Hall-effect sensor 12, in this non-limiting example, includes an annular core 40 having a small gap into which a Hall-sensor 42 is inserted. A magnetic field generated by current flowing through conductor 36 is induced upon core 40, which concentrates the magnetic field on the Hall-sensor 42 to generate a voltage on lines 44 that is proportional to the current flowing through the conductor 36. The voltage on lines 44 are, in certain non-limiting examples, processed through signal conditioner 24, which can include filters, amplifiers, etc. In alternate embodiments, the signal conditioner 24 may be omitted. The analog signal from the Hall-sensor 42 is then applied to ADC 14 to provide a digital signal to processor 22.

Temperature sensor 16 may include one or more discrete elements, such as a thermistor, a resistor, etc. By way of non-limiting example, temperature sensor 16 can be the series connection of a thermistor and a resistor between a voltage source and ground to provide a temperature-dependent voltage divider. An analog output signal of the temperature sensor 16 can be applied to ADC 18 to provide a digital signal to processor 22.

Mode selector 22 is preferably manually controlled and develops an operating mode selection digital signal for processor 22. For example, mode selector 22 can select between a temperature-compensated direct current (DC) transducer mode and a calibration mode. The mode selector 22 can be implemented in a variety of technologies, including mechanical, electromechanical and electronic. In an example embodiment, the mode selector comprises one or more "jumpers" provided on a printed circuit (PC) board or connector. In another example embodiment, the mode selector comprises one or more mechanical switches. Other technologies can also be used, such a manually activated electronic switches, reed switches, etc. For two operating modes, only a single bit of information from the mode selector is required, e.g. the operating mode selection digital signal applied to processor 22 by mode selector 20 can be a "1" or a "0". For more than two operating modes, or for additional parameters to be input into processor 22 for one or more operating modes, additional bits of information can be provided to the processor 22, either in parallel or in series.

The optional output indicator 28 is, in this example, a light-emitting diode (LED) coupled to an output of processor 22. The LED 28 of this example may be directly coupled to an I/O pin of the processor 22, or may be coupled to processor 22 by buffers, registers, drivers, etc. A purpose of the output indicator 28, in certain example embodiments, is to provide status information concerning the operation of the DC transducer 10.

Optional filter 26 can comprise a digital-to-analog converter (DAC) which converts the digital output of processor 22 into an analog signal. By way of non-limiting example, a DAC can comprises a simple resistor/capacitor (RC) network. Other filters, both passive and active, are also applicable for various applications, as will be appreciated by those of skill in the art.

Figure 2:
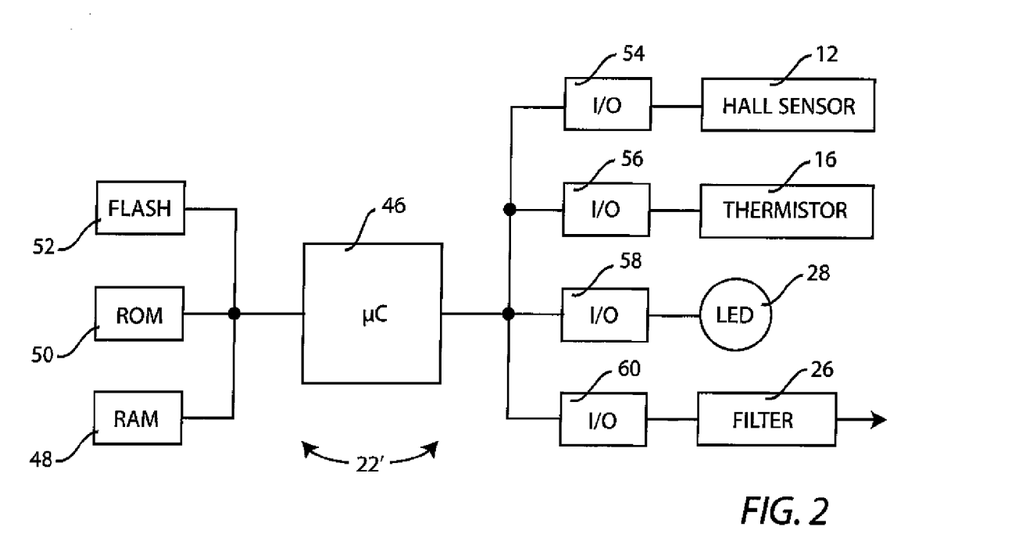
FIG. 2 is a block diagram of an example processor of FIG. 1.

FIG. 2 is a block diagram of an example processor 22' including a microcontroller (µC) 46, random access memory (RAM) 48, read-only memory (ROM) 50, Flash memory 52, I/O 54 comprising ADC 14 coupled to Hall-effect sensor 12, I/O 56 comprising ADC 18 coupled to temperature sensor 16 (in this case including a thermistor), I/O 58 coupled to LED 28, and I/O 60 coupled to filter 26. The types and number of memory and I/O circuits are set forth by way of example and not limitation, as will be appreciated by those of ordinary skill in the art. Furthermore, the I/O may, in some example embodiments, be I/O leads or "pins" of microcontroller 46 and, in other example embodiments, may be registers, drivers, circuits, etc.

Microcontroller 46 of FIG. 2 is illustrated, by way of example and not limitation, as a type of microprocessor or microcontroller that is available from a number of sources. For example, an 8-pin Flash microcontroller from Microchip Technology, Inc., part number PIC12(L)F1840 has been found to be suitable. As will be appreciated by those of skill in the art, however, other forms of microcontroller 46 are also suitable for certain applications. Also, instead of using a microcontroller or microprocessor, functionality of processor 22 may be implemented as a state machine, in discrete logic, or otherwise. As noted, in the example of FIG. 2, the processor 22' includes digital memory (e.g., memories 48, 50 and 52) that can include code segments (sometimes referred to as machine code) that are executable on the microcontroller 46, as well as other information or data, such as thermal curve information. Code segments and data stored in non-volatile memory, such as Flash memory 52, is sometimes referred to as "firmware."

Figure 3:
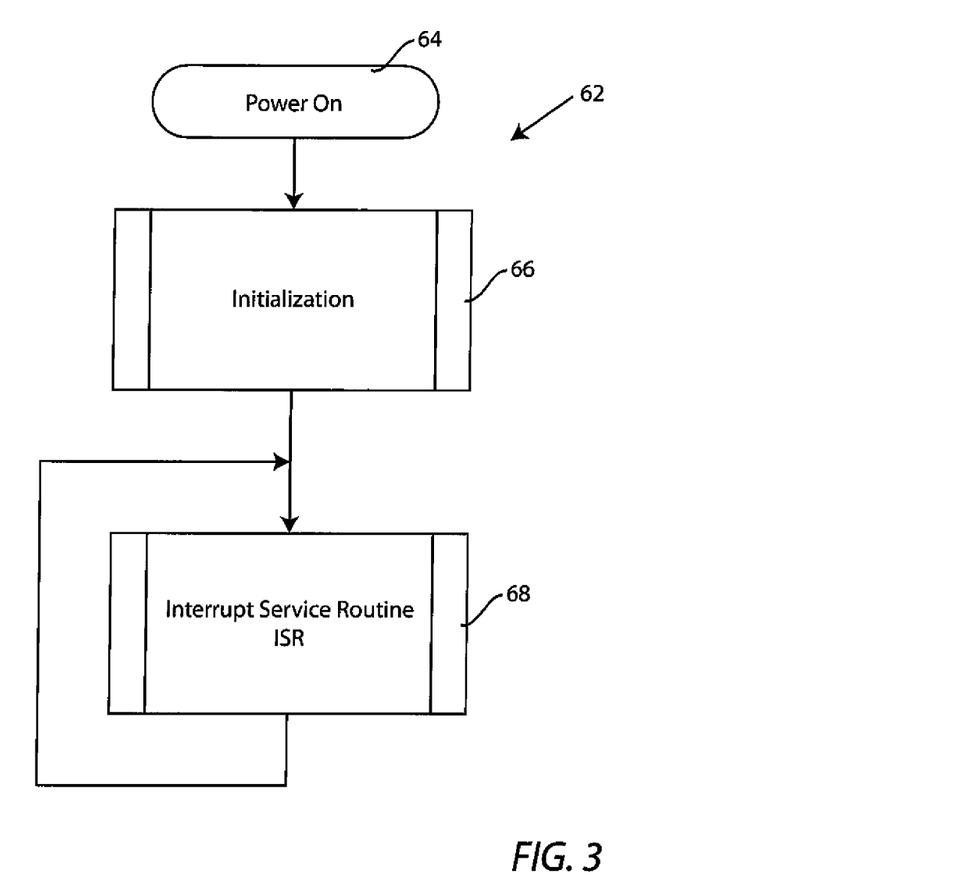
FIG. 3 is a flow diagram of an example operation of a digitally controlled direct current transducer.

FIG. 3 is a flow diagram of an example process 62 of operation for digitally controlled DC transducer 10. In this non-limiting example, process 62 begins with a "power on" event 64, and continues with a DC transducer 10 initialization process ("Initialization") 66. After the completion of the Initialization 66, process 62 enters into a continuously looping Interrupt Service Routine (ISR) 68.

Figure 4:
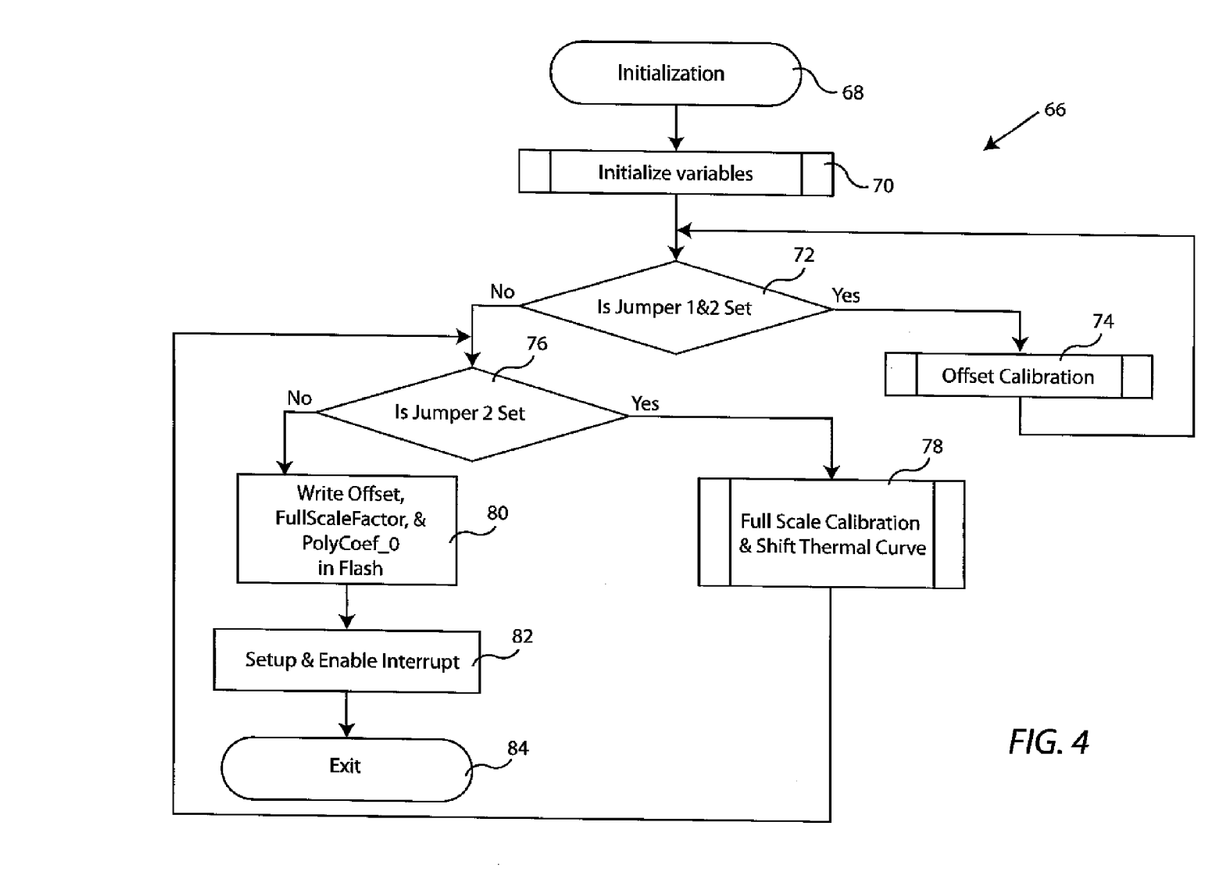
FIG. 4 is a flow diagram of an example Initialization process of FIG. 3.

FIG. 4 is a flow diagram of an example Initialization process 66 of FIG. 3. In this non-limiting example, Initialization 66 is entered at 68 and variables are initialized in an Initialize Variables operation ("process") 70. Next, in a decision operation 72, it is determined if "Jumper 1 & 2" are set. In this non-limiting example, Jumpers 1 & 2 comprise the mode selector 20 of FIG. 1. In alternate embodiments, other types of mode selectors can be uses, such as switches. If "YES", an Offset Calibration operation 72 is performed, and process control is returned to operation 72. If "NO" an operation 76 determines whether Jumper 2 is set. If "YES", an operation 78 performs Full Scale Calibration & Shift Thermal Curve. Process control is then returned to operation 76. If "NO", an operation 80 writes the variables Offset, FullScaleFactor & PolyCoef 0 into Flash memory 52 (see FIG. 2). Next, an operation 82 executes a Setup & Enable Interrupt procedure, and the process 66 is exited at 84.

Figure 5:
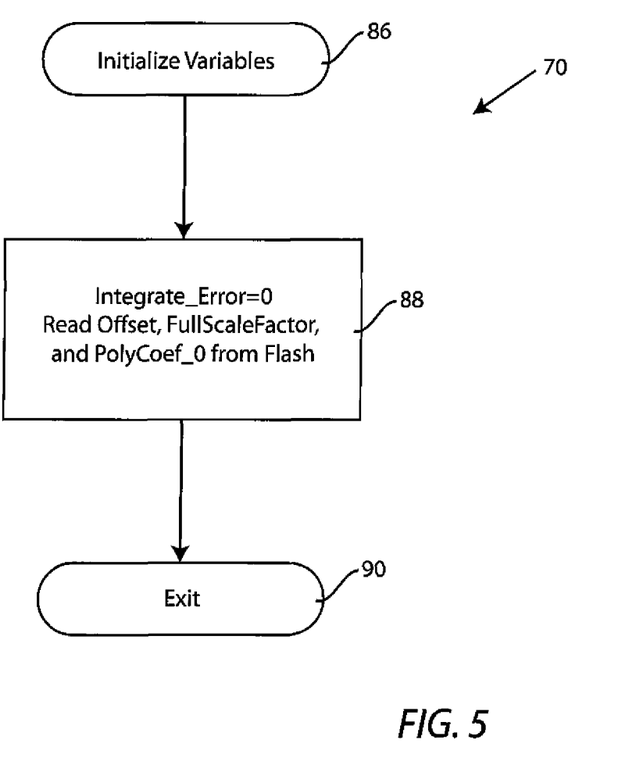
FIG. 5 is a flow diagram of an example Initialize Variables process of FIG. 4.

FIG. 5 is a flow diagram of an example Initialize Variables process 70 of FIG. 4. In this non-limiting example, the Initialize Variables process 70 is entered at 86 and, in an operation 88, the variable Integrate_Error is set to zero and the variables Offset, FullScaleFactor, and FolyCoef_0 are read from Flash memory. Process 70 is completed with an Exit operation 90.

Figure 6:
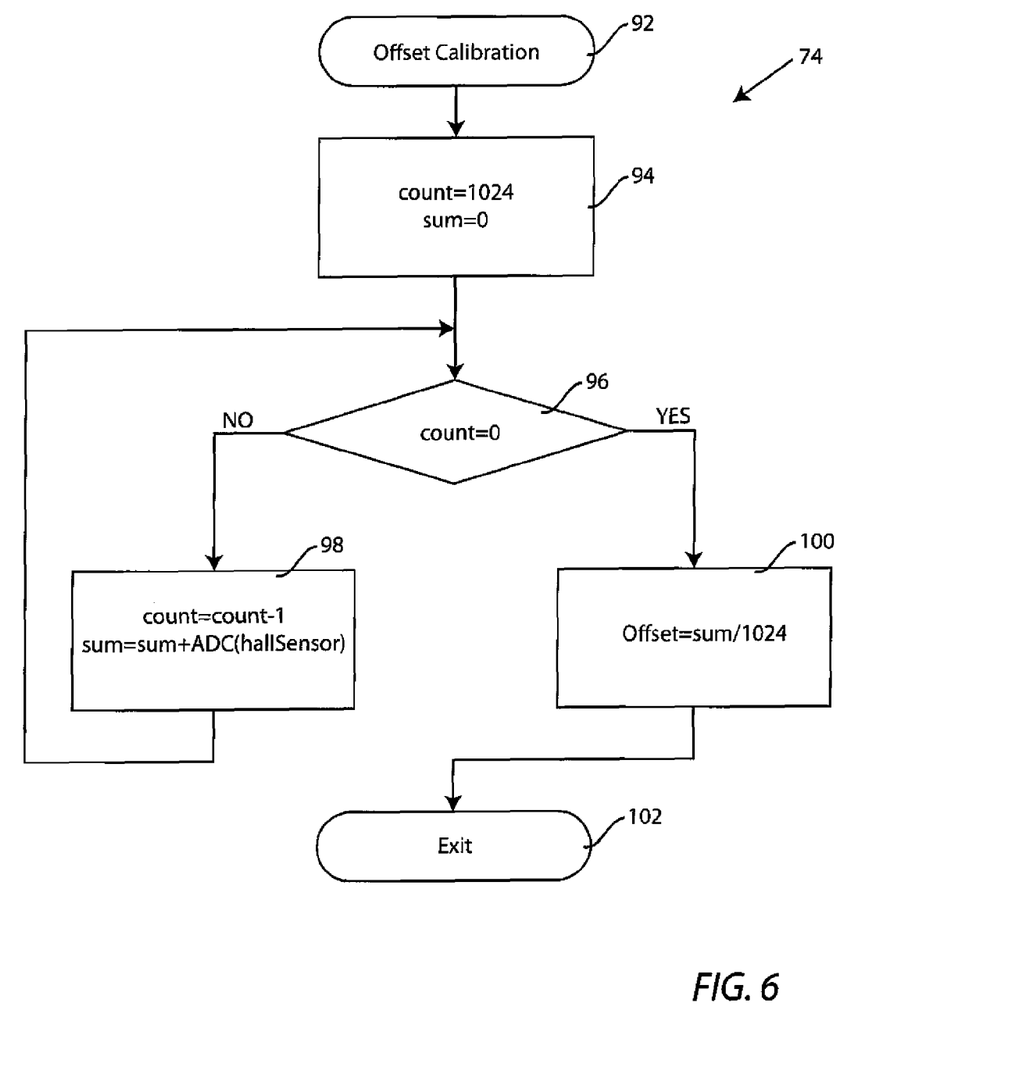
FIG. 6 is a flow diagram of an example Offset Calibration process of FIG. 4.

FIG. 6 is a flow diagram of an example Offset Calibration process 74 of FIG. 4. Process 74 begins at 92 and, in an operation 94, the variable count is set to 1024 and the variable sum is set to zero. Next, in a decision operation 96, it is determined whether the variable count is zero. If "NO", an operation 98 decrements the variable count by 1, and increments the variable sum by the value ADC (hallSensor), which is the digital signal from ACD 14 of FIG. 1, in this non-limiting example. Process control is then returned to operation 96. If count=0, operation 100 calculates the variable Offset as sum/1024, and the process 74 is exited at 102.

It will therefore be appreciated that with the non-limiting example Offset Calibration process 74 described above, over one thousand averages of the digitized output of the Hall-effect sensor 12 are taken when there is no input to the unit (e.g. there is no current flowing through a conductor 36). Therefore, if there is any "current" detected by the DC transducer when no current is actually present, the variable Offset represents the combined offsets from the Hall-effect sensor, signal conditioner, and the A/D converter.

Figure 7:
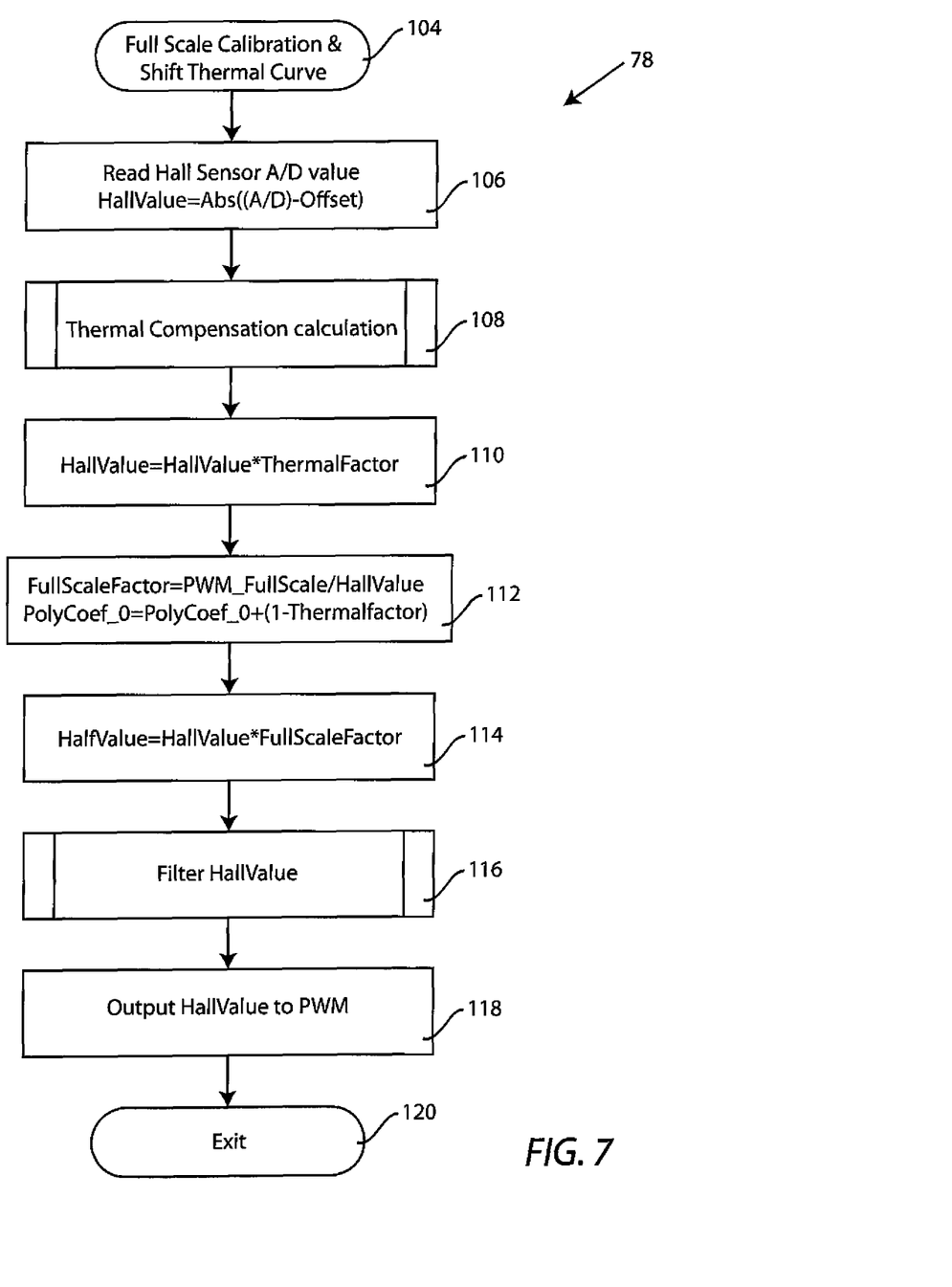
FIG. 7 is a flow diagram of an example Full Scale Calibration and Temperature Curve Shift process of FIG. 4.

FIG. 7 is a flow diagram of an example Full Scale Calibration and Shift Thermal Curve process 78 of FIG. 4. Process 78 is entered at 104 and, in an operation 106, the digitized hall sensor value A/D is read and the variable HallValue is calculated as the absolute value of A/D minus the Offset value calculated by process 74. Next, in an operation 108, there is a Thermal Compensation calculation, after which an operation 110 updates the variable HallValue as the product of Hallvalue and ThermalFactor. Next, in an operation 112, a FullScaleFactor variable is calculates as PWM_FullScale divided by HallValue, where PWM_FullScale is the full scale value for the Pulse Width Modulation (PWM) digital output of the processor 22. The variable PolyCoef_0 is updated by adding PolyCoef to 1-ThermalFactor. Then, in an operation 114, the variable HallValue is updated by multiplying itself by the FullScaleFactor. Operation 116 filters HallValue, and an operation 118 outputs HallValue to a PWM process. The process 78 then exits at 120.

It should be noted that process 78, during factory calibration, will have a factory technician input the FullScale value into the DC current transducer, and that code segments stored in the firmware, as described herein, will normalize the DC current transducer output so that it will be at full scale. In certain non-limiting examples, the normalization factor can be used as the FullScaleFactor. It should also be noted that PolyCoef_0 is, in this non-limiting example, a coefficient A0 of a polynomial representing the thermal curve of the device. Operation 112 therefore adjusts the A0 coefficient, which will shift the thermal curve up or down according to the ambient temperature at the time of calibration. In this non-limiting example, temperature compensation while in the temperature-compensated DC transducer mode is referenced from this shifted curve.

In a non-limiting example, the function for temperature compensation can be base from empirical laboratory test data. For example, the behavior of the Hall-effect sensor circuitry can be plotted for a range of temperatures, e.g. from −20 C to 60 C in 10 degree increments. Using the temperature data as a reference, the gain ratio can be plotted as a ratio of temperature. To obtain the gain function values, data at the extremes can be discarded and the remaining values between 25 A and 40 A can be averaged. This tends to be the flattest part of the curve, providing consistent gain values. To obtain a correction value as a function of temperature, the inverse of the gain ratio value is calculated as:

$$\text{CorrectionFactor} = \text{function}(\text{temperature}) \qquad \text{Equation 1}$$

Figure 8:
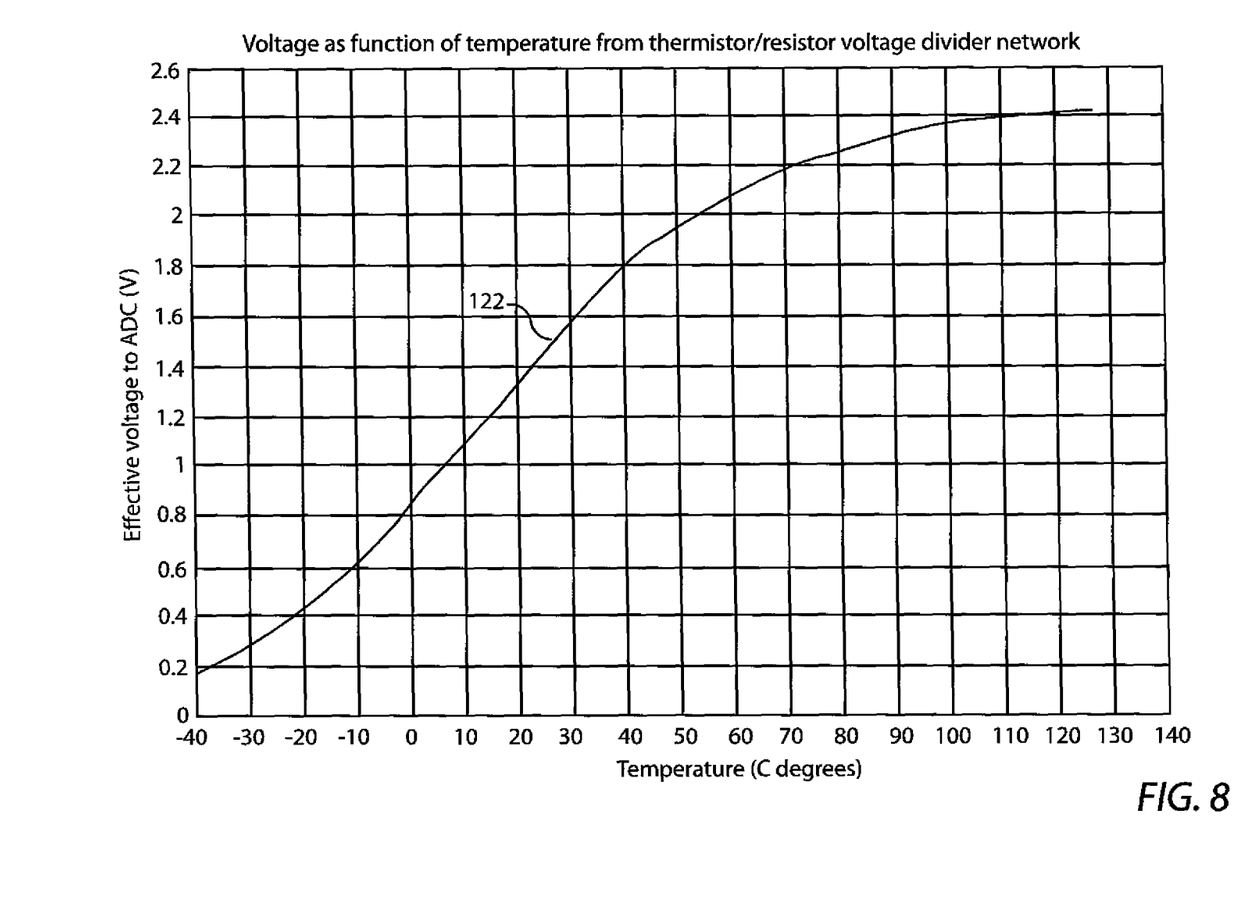
FIG. 8 is a graph of an example analog output of a temperature sensor as a function of temperature.

FIG. 8 is a graph of an example analog output of a temperature sensor as a function of temperature. In this non-limiting example, a thermistor and a resistor are coupled, in series, to a voltage source to form a voltage divider circuit having a non-linear analog voltage signal curve 122 that is a function of temperature.

Figure 9:
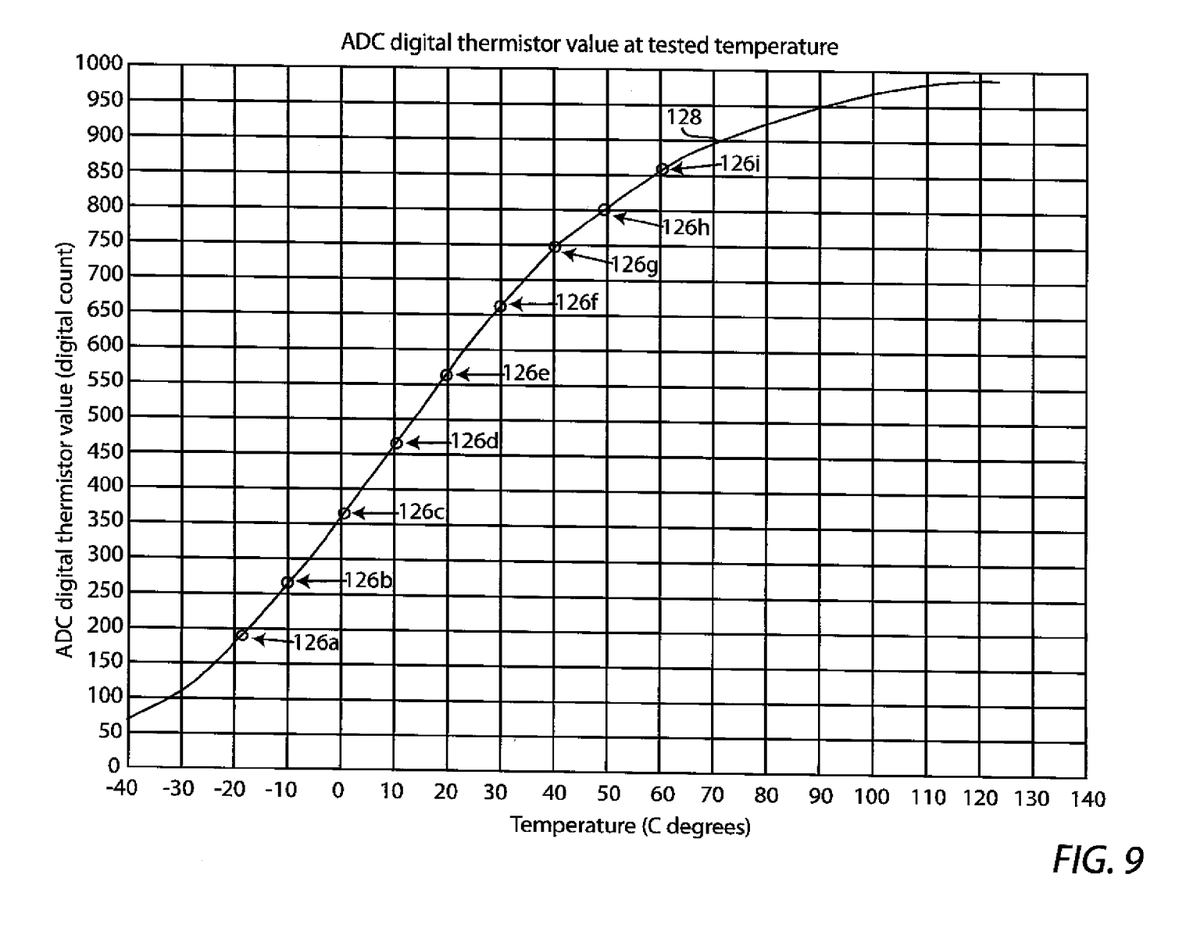
FIG. 9 is a graph representing example digitized thermistor values as a function of temperature.

FIG. 9 is a graph representing example digitized thermistor values ("points") as a function of temperature labelled 126a-126i. The points 126a-126i can be used to extrapolate a function or curve 128. Therefore, in this example, the processor 22 receives the digitized thermistor values as a function of temperature according to the following equation:

$$\text{ThermistorValue} = \text{function}(\text{temperature}) \qquad \text{Equation 2}$$

Taking the inverse function of Equation 2, the following equation is obtained:

$$\text{temperature} = \text{InverseFunction}(\text{ThermistorValue}) \qquad \text{Equation 3}$$

and then substituting Equation 3 into Equation 1 results in the following:

$$\text{CorrectionFactor} = \text{function}(\text{InverseFunction}(\text{ThermistorValue})) \qquad \text{Equation 4}$$

Figure 10:
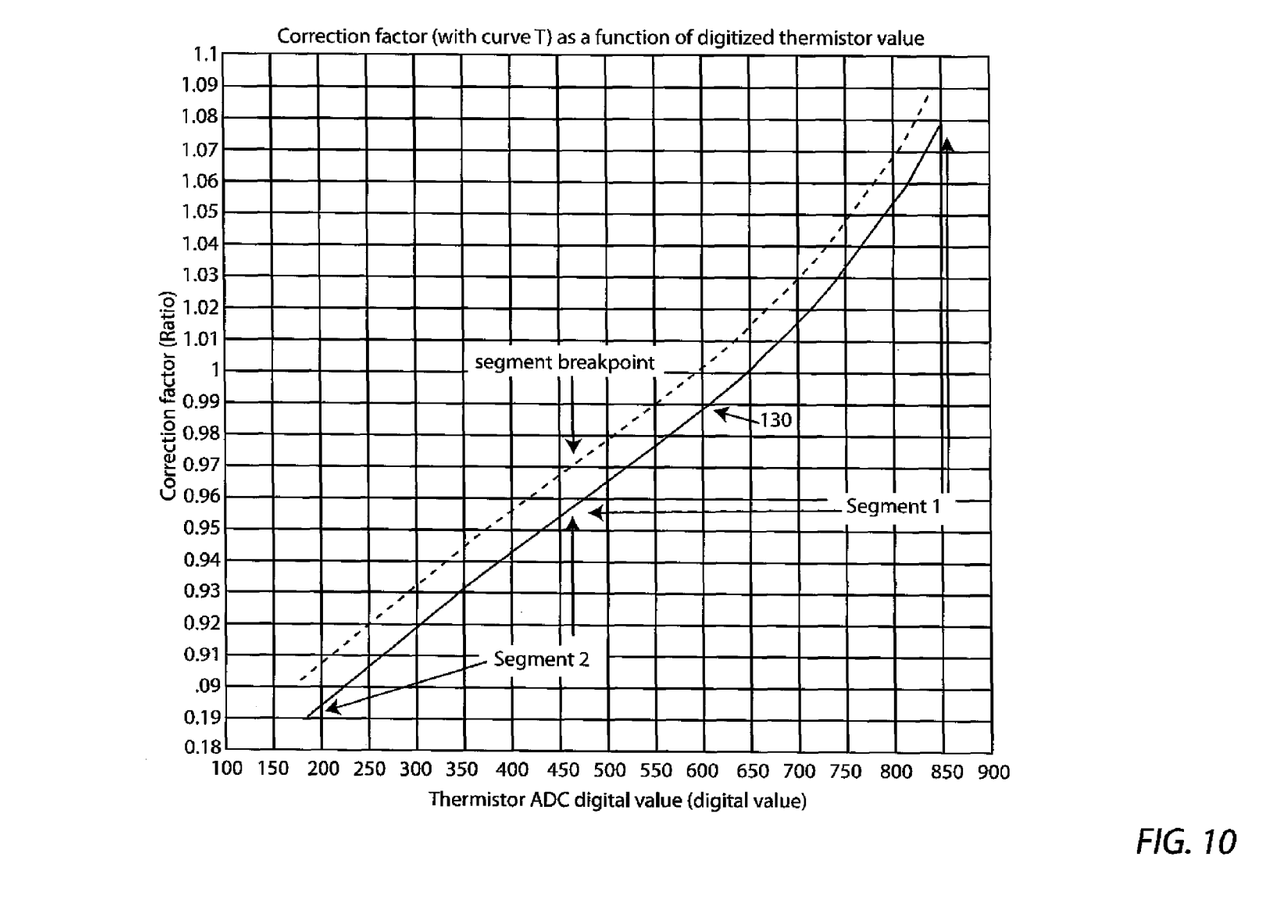
FIG. 10 is a graph illustrating an example correction factor (with curve fit) as a function of the digitized thermistor values of FIG. 9.

FIG. 10 is a graph illustrating an example correction factor curve-fitted curve 130 as a function of the digitized thermistor values of FIG. 9. This leads to the following equation:

CorrectionFactor=newfunction(ThermistorValue)  Equation 5

The broken line curve above the curve-fitted curve 130 represents curve shift at different calibration temperatures. During the calibration at any given temperature, the curve will shift to the point that the thermal correction factor will be unity. In this way, the processor 22 can be low in cost, since does not have to do complex calculations such as division math, which can require thousands of instruction cycles during normal operation.

Figure 11:
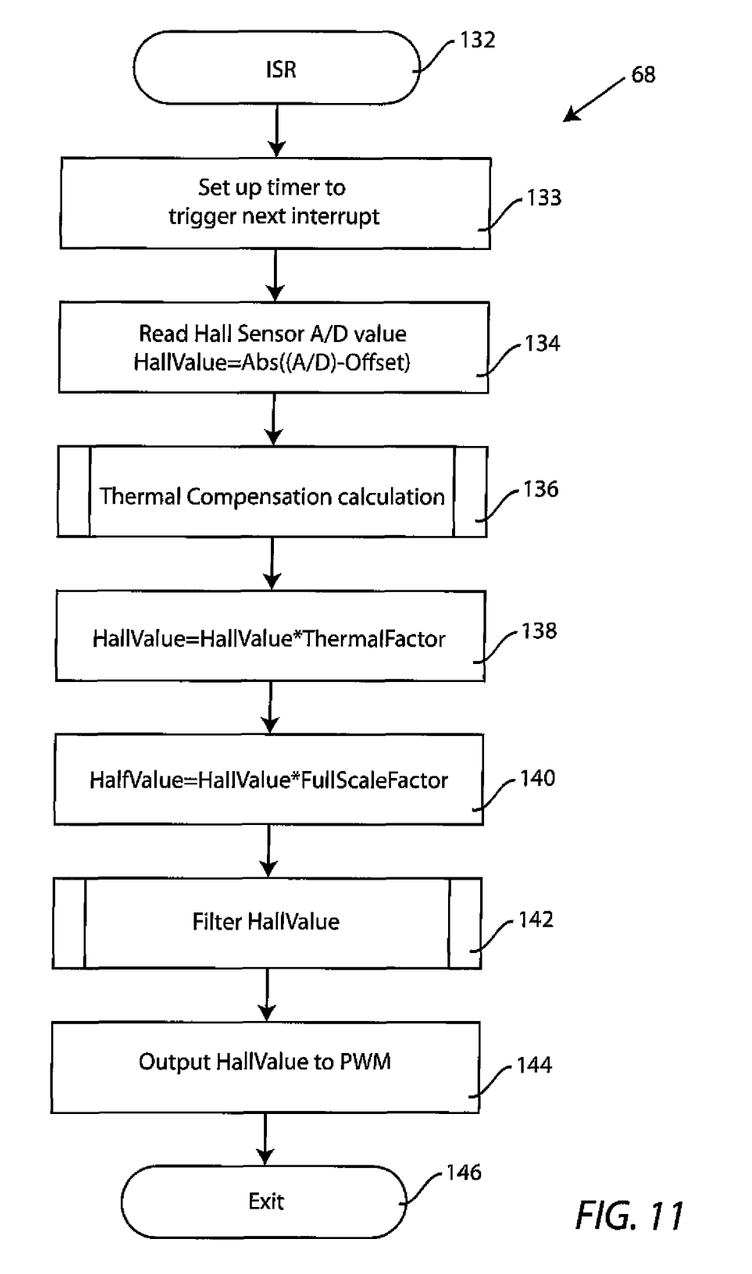
FIG. 11 is an example Interrupt Service Routine (ISR) process of FIG. 3.

FIG. 11 is an example Interrupt Service Routine (ISR) process 68 of FIG. 3. Process 68 is entered at 132. In an operation 133, a timer is set up to trigger the next interrupt and, in an operation 134, the Hall-effect sensor value ("A/D") is read and the HallValue variable is set as the absolute value of A/D minus Offset. Next, in an operation 136, there is a Thermal Compensation calculation and, in an operation 138 the value of HallValue is updated by multiplying itself by the ThermalFactor. In operation 140, HallValue is further updated by multiplying itself by FullScaleFactor, and in operation 142 HallValue is filtered. Then, operation 144 outputs HallValue to the Pulse Width Modulation (PWM) process, and process 68 exits at 146. It should be noted the process 68 of FIG. 11 has substantial overlap with process 78 of FIG. 7, such that processes and subroutines can be shared between these two processes.

Figure 12:
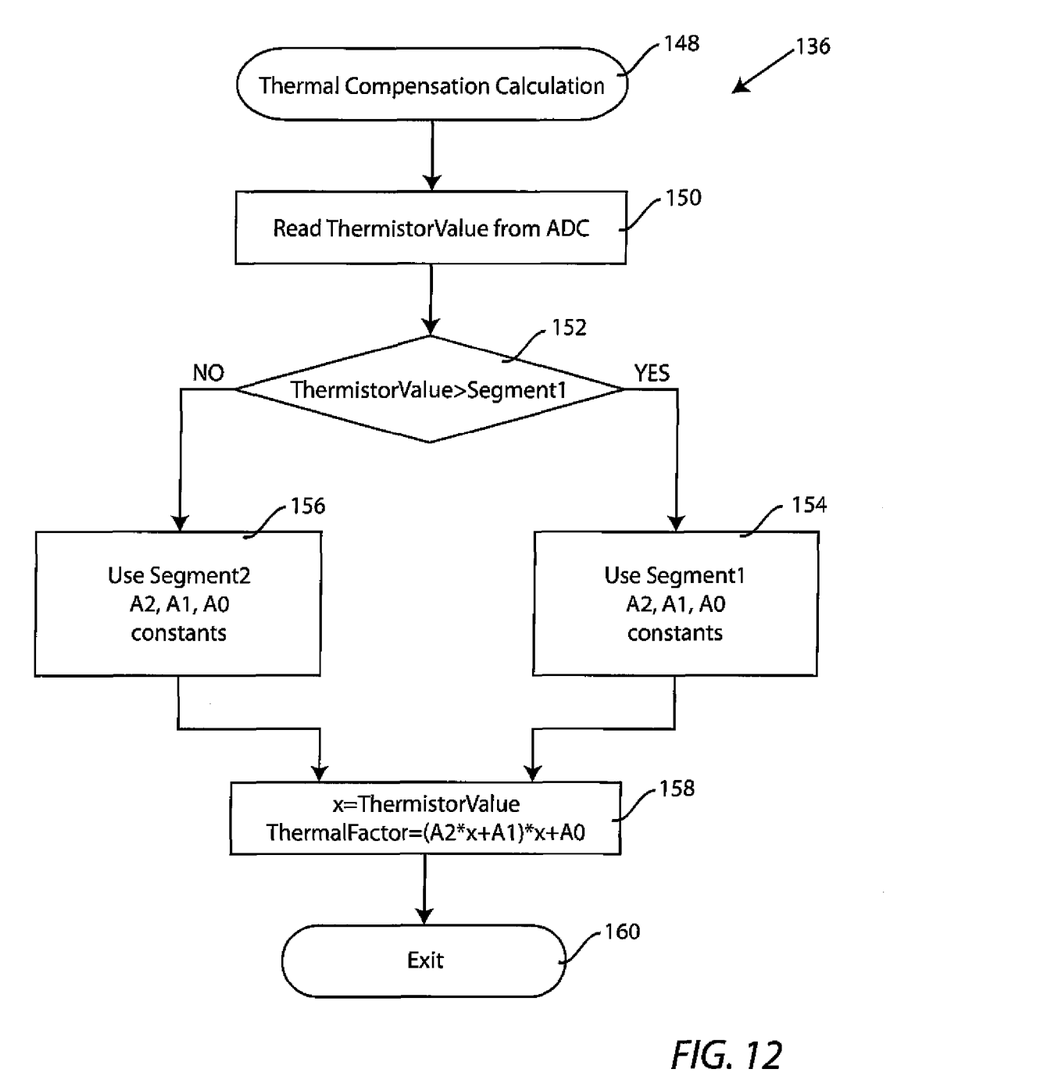
FIG. 12 is a flow diagram of an example Thermal Compensation Calculation process of FIG. 11.

FIG. 12 is a flow diagram of an example Thermal Compensation Calculation process 136 of FIG. 11. The process 136 is entered at 148 and, in an operation 150, ThermistorValue is read from ADC 18 of FIG. 1. Next, in a decision operation 152, it is determined if ThermistorValue is greater than Segment1 (see FIG. 10). If "YES", an operation 154 uses Segment1 A2, A1 and A0 polynomial constants and operation 152 calculates the ThermalFactor as follows:

ThermalFactor=(*A2*\*ThermistorValue+*A1*)\*ThermistorValue+*A0*  Equation 6

If operation 152 determines that ThermistorValue is not greater than Segment1, operation 156 uses Segment1 A2, A1 and A0 polynomial constants for the calculation of the ThermalFactor in operation 152. After the completion of operation 152, process 136 exits at 160.

It should be noted with respect to the graph of FIG. 10 and the process 136 of FIG. 12 that, due to the thermal compensation curve having an inflection point, to characterize the function represented by the entire curve 130 would require a third degree polynomial curve fit, which is very computationally expensive. Therefore, in this non-limiting example, the curve 130 is divided into two segments and two, computationally less expensive, second degree polynomials are used to fit the curve segments. This allows the use of only three additional coefficients an one compare/branch instruction is needed to replace hundreds of instructions for multiplication and addition that would be required to fit the curve to a third degree polynomial function.

In a non-limiting example embodiment, a two stage filter is employed to reduce low spectrum Hall-effect sensor noise without significantly slowing down the overall system response time. In this embodiment, when the Hall-effect sensor output is greater than the PWM output by 0.4% of full scale, a new PWM takes the full Hall-effect sensor output. This is considered to be a superior solution to having the firmware filter the Hall-effect sensor signal with a slow (low bandwidth) filter.

Figure 13:
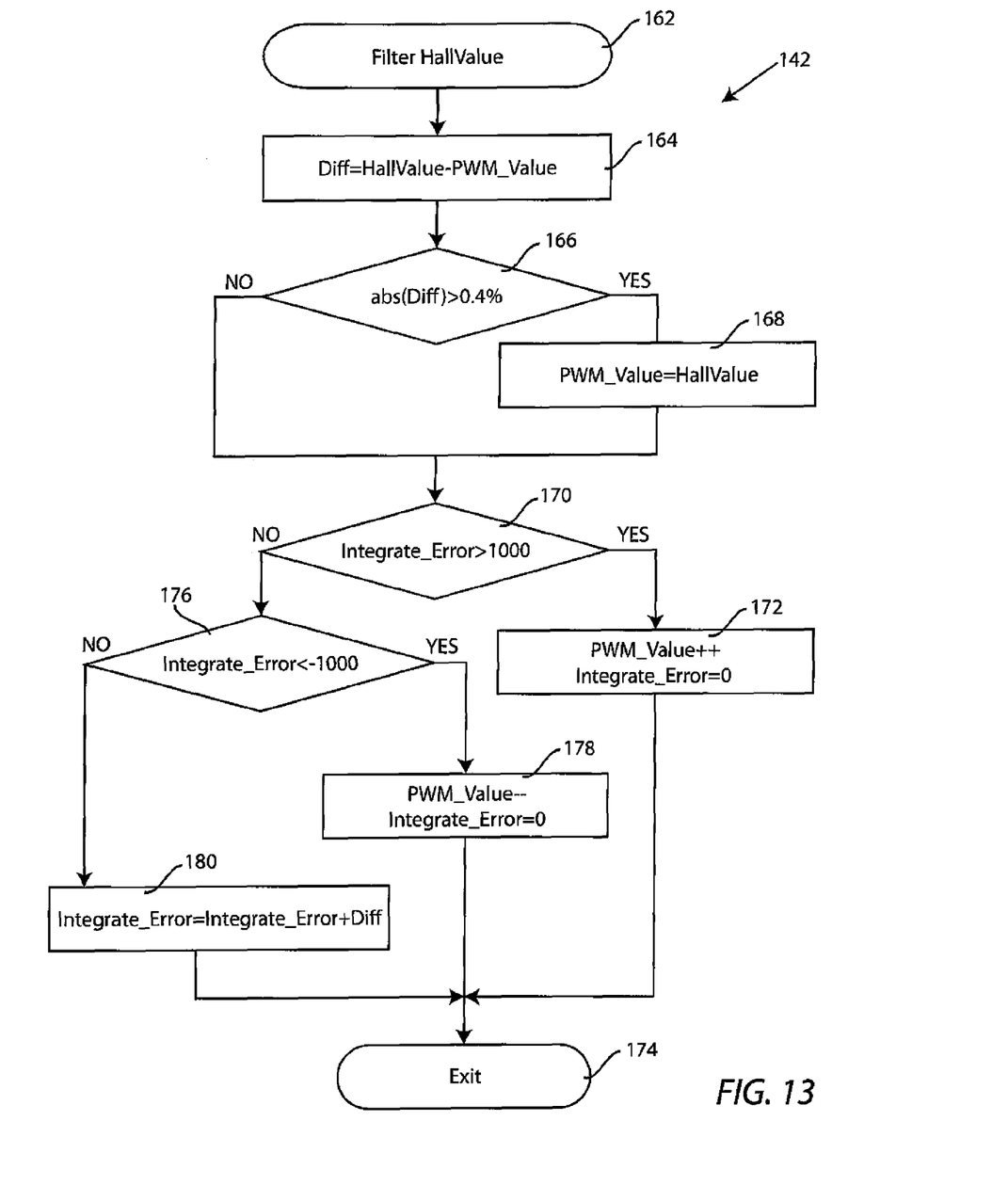
FIG. 13 is a flow diagram of an example Filter HallValue process of FIG. 11.

FIG. 13 is a flow diagram of an example Filter HallValue process 142 of FIG. 11 which implements the aforementioned two stage filtering process. Process 142 is entered at 162 and, in an operation 164, the variable Diff is calculated as HallValue minus PWM_Value. Next, in a decision operation 166, is it determined whether the absolute value of Diff is greater than 0.4%. If "YES", operation 168 sets PWM_Value to HallValue, and then decision operation 170 determines whether Integrate_Error is greater than 1000. If "YES", PWM_Value is incremented and Integrate_Error is set to zero in an operation 172 before exiting process 142 at Exit 174.

If the result of decision operation 166 is "NO", process control is given to decision operation 170. If the decision of operation 170 is "YES", the process flow proceed through operation 172 to Exit operation 174, as before. If the decision is "NO", a decision operation 176 determines if Integrate_Error is less than −1000. If "YES", an operation 178 decrements PWM_Value, sets Integrate_ Error to zero, and process 142 exits at Exit 174. If "NO", operation 180 updates Integrate_Error by adding Diff to itself before exiting the process at 174.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A digitally controlled direct current transducer comprising:
   an open-loop Hall-effect sensor operative to develop a first sensor analog output;
   a first analog-to-digital converter (ADC) having an input coupled to the first sensor analog output and developing a first digital signal;
   a temperature sensor operative to develop a second sensor analog output;
   a second analog-to-digital converter (ADC) having an input coupled to the second sensor analog output and developing a second digital signal;
   a manually controlled mode-selection device operative to develop an operating mode selection digital signal for a plurality of operating modes, wherein the operating modes include a temperature-compensated direct current (DC) transducer mode and a calibration mode;
   a digital processor responsive to the first digital signal, the second digital signal and the operating mode selection digital signal; and
   digital memory coupled to the digital processor including thermal curve information and code segments executable on the digital processor for:
   a) performing initialization routines in response to the powering-up of the digital processor;
   b) operating in the temperature-compensated DC transducer mode using the first digital signal, the second digital signal and the thermal curve information to produce a digital output of the digital processor that is representative of the first sensor analog output when the manually controlled mode-selection device is set to develop the operating mode selection digital signal for the temperature-compensated DC transducer mode; and
   c) operating in the calibration mode when the manually controlled mode-selection device is set to develop the operating mode selection digital signal for the calibration mode.

2. A digitally controlled direct current transducer as recited in claim 1 further comprising a signal conditioner coupling the first sensor output to the input of the first ADC.

3. A digitally controlled direct current transducer as recited in claim 2 further comprising a filter coupled to the digital output of the digital processor.

4. A digitally controlled direct current transducer as recited in claim 3 wherein the digital output of the digital processor comprises a pulse-width modulated (PWM) signal.

5. A digitally controlled direct current transducer as recited in claim 4 wherein the filter comprises a resistor/capacitor (RC) network.

6. A digitally controlled direct current transducer as recited in claim 2 further comprising an output indicator coupled to the digital processor.

7. A digitally controlled direct current transducer as recited in claim 6 wherein the output indicator is a light emitting diode (LED).

8. A digitally controlled direct current transducer as recited in claim 2 wherein the digital memory includes read/write memory storing calibration and thermal curve shift data developed by the digital processor during the calibration mode.

9. A digitally controlled direct current transducer as recited in claim 1 wherein the manually controlled mode-selection device comprises at least one electrical jumper.

10. A digitally controlled direct current transducer as recited in claim 1 wherein the manually controlled mode-selection device comprises at least one electrical switch.

11. A digitally controlled direct current transducer as recited in claim 1 wherein the temperature sensor comprises a thermistor.

12. A direct current transducer comprising:
an open-loop Hall-effect sensor operative to develop a Hall-effect sensor analog output;
a first analog-to-digital converter (ADC) having an input coupled to the Hall-effect sensor analog output and developing a Hall-effect digital signal;
a thermistor operative to develop a thermistor analog output;
a second analog-to-digital converter (ADC) having an input coupled to the thermistor analog output and developing a thermistor digital signal;
a manually controlled mode-selection device operative to develop an operating mode selection digital signal for a plurality of operating modes, wherein the operating modes include a temperature-compensated direct current (DC) transducer mode and a calibration mode;
a digital processor responsive to the Hall-effect digital signal, the thermistor digital signal and the operating mode selection signal; and
digital memory coupled to the digital processor including thermal curve information and code segments executable on the digital processor for:
a) operating in the temperature-compensated DC transducer mode using the Hall-effect digital signal, the thermistor digital signal and the thermal curve information to produce a digital output of the digital processor that is representative of the Hall-effect sensor analog output when the manually controlled mode-selection device is set to develop the operating mode selection digital signal for the temperature-compensated DC transducer mode; and
b) operating in the calibration mode when the manually controlled mode-selection device is set to develop the operating mode selection digital signal for the calibration mode.

13. A direct current transducer as recited in claim 12 further comprising a signal conditioner coupling the Hall-effect sensor analog output to the input of the first ADC.

14. A direct current transducer as recited in claim 13 wherein the digital output of the digital processor comprises a pulse-width modulated (PWM) signal.

15. A direct current transducer as recited in claim 14 further comprising a resistor/capacitor (RC) network coupled to the digital output of the digital processor.

16. A direct current transducer as recited in claim 12 further comprising a light emitting diode (LED) output indicator coupled to the digital processor.

17. A direct current transducer as recited in claim 12 wherein the digital memory includes read/write memory storing calibration and thermal curve shift data developed during by the digital processor during the calibration mode.

18. A direct current transducer as recited in claim 12 wherein the manually controlled mode-selector comprises at least one electrical jumper.

19. A direct current transducer as recited in claim 12 wherein the manually controlled mode-selector comprises at least one electrical switch.

* * * * *